United States Patent [19]

Ailion et al.

[11] Patent Number: 4,818,937

[45] Date of Patent: Apr. 4, 1989

[54] RAPID LINE SCAN NMR IMAGING

[75] Inventors: David C. Ailion, Salt Lake City, Utah; Thomas A. Case, Oakland, Calif.; Krishnamurthy Ganesan, Salt Lake City, Utah

[73] Assignee: University of Utah, Salt Lake City, Utah

[21] Appl. No.: 162,750

[22] Filed: Mar. 1, 1988

[51] Int. Cl.$^4$ .............................................. G01R 33/20
[52] U.S. Cl. ...................................... 324/309; 324/310
[58] Field of Search ................. 128/653; 324/300, 307, 324/309, 310, 312, 313, 314

[56] References Cited

U.S. PATENT DOCUMENTS

| | | | |
|---|---|---|---|
| 4,184,110 | 1/1980 | Hinshaw | 324/313 |
| 4,297,637 | 10/1981 | Crooks et al. | 324/309 |
| 4,486,708 | 12/1984 | Macovski | 324/309 |
| 4,523,596 | 6/1985 | Macovski | 324/309 |
| 4,528,985 | 7/1985 | Macovski | 324/309 |
| 4,565,968 | 1/1986 | Macovski | 324/309 |
| 4,577,152 | 3/1986 | Macovski | 324/309 |
| 4,579,121 | 4/1986 | Macovski | 324/309 |
| 4,599,565 | 7/1986 | Hoenninget | 324/309 |
| 4,733,183 | 3/1988 | Young | 324/309 |

Primary Examiner—Michael J. Tokar
Attorney, Agent, or Firm—Trask, Britt & Rossa

[57] ABSTRACT

NMR imaging is effected by application of two normal diagonal planes to develop line volumes at major intersections which are converted into a slice image. Rapid line scan imaging is achieved by successive diagonal excitation of previously unexcited regions. Spoiler magnetic gradient fields and applied periodically to dephase and in turn eliminate minor or spurious echoes from other intersections of the two normal diagonal planes.

9 Claims, 9 Drawing Sheets

RAPID LINE SCAN NMR IMAGING

BACKGROUND OF THE INVENTION

1. Field

This invention relates to NMR imaging (Magnetic Resonance Imaging, MRI) systems and techniques, and more particularly to an NMR rapid line scan technique for developing two-dimensional images from a plurality of line scans.

2. State of the Art

Nuclear magnetic resonance (NMR) is presently a recognized phenomenon in which the nucleus of selected atoms can be excited by a particular or selected resonant radio frequency (RF) signal. Based on this phenomenon, a number of NMR techniques have been devised to generate images of a specimen. NMR apparatus employing these techniques are capable of producing complicated pulse sequences automatically and are capable of automatically recording certain echo signals resulting from those pulse sequences as applied to a particular target or specimen for further processing through a compute to produce the images of the specimen which may be regarded as a slice image.

NMR imaging apparatus are described in the book, *NMR Imaging in Biomedicine,* P. Mansfield and P. G. Morris, 1982 Academic Press, New York, N.Y. (Library of Congress Catalog Card No. 65-26774). NMR imaging apparatus and techniques are also described in U.S. Pat. No. 4,599,565 (Hoenninger, III et al.); U.S. Pat. No. 4,614,195 (Bottomley, et al.); and U.S. Pat. No. 4,583,044 (Case et al.).

The NMR imaging described in the above-noted patents and text is based on the ability to induce and monitor the resonance of the magnetic moment of selected nuclei in the presence of magnetic fields. If the magnetic fields are varied spatially, it is possible to measure both the location and concentration in small volumes of particular nuclei and to process that data with a computer into a visual display or slice image that reflects the distribution of those nuclei in the tissue or the sample. In medical applications, NMR imaging is a noninvasive diagnostic technique which has some general similarity to computer tomography scanning (utilizing X-ray radiation), even though it is based upon an entirely different physical phenomenon.

NMR systems typically include a large magnet to create a homogenous magnetic field around and within the target or specimen as well as a plurality of coils to create position-dependent or spatially-related fields within the homogenous field. Further, one or more RF coils are positioned near or around the target or specimen to apply the resonant radio frequency (RF) signals and receive the NMR signal. Associated electronic circuitry processes the received signals (called spin echoes) into information suitable for display on a screen such as a CRT tube.

U.S. Pat. No. 4,599,565 (Hoenninger, III et al.), describes a two-dimensional Fourier transform (2DFT) method. Various spaced apart subvolume regions of a particular sample are each sequentially excited in order to allow sufficient time for the excited nuclei or atomic particles in each subvolume to return to normal or to relax. In U.S. Pat. No. 4,599,565, spatial division multiplexing techniques are used to develop an acceptable image over time. However, the technique needed to develop the image permits artifacts due to movement of the specimen.

In typical imaging techniques including NMR techniques heretofore known, sufficient time elapses between the beginning and the completion of the sampling so that any motion of the object being sampled or examined results in substantial artifacts or ambiguities in the reproduced image. For example, if 2DFT NMR imaging techniques are used to generate an image of the chest area proximate the heart, the motion of the heart as it beats is sufficient to generate substantial artifacts or ambiguities in the signal. Similarly, motion of the chest wall from breathing may cause substantial artifacts or ambiguities, and thereby prevent the use of NMR imaging as an effective medical diagnostic tool.

There is a need for an NMR imaging system and method in which the motion of the object does not produce artifacts or ambiguities in the reproduced image constructed and displayed on an appropriate video screen.

SUMMARY OF THE INVENTION

A method of NMR line scan imaging involves the use of conventional NMR imaging equipment appropriately modified and operated to apply gradient magnetic fields sequentially to in turn generate sequentially a plurality of pairs of intersecting planes to produce sequentially (over time) a plurality of main intersections. The main intersections occur in a specimen which has been positioned within a main magnetic field. Each of the pairs of planes is comprised of a first plane and a second plane which intersects the first plane. Each of the planes is a plane of atomic particles of a specimen which have been appropriately excited by RF magnetic field pulses varied at a selected resonant frequency to in turn cause generation of a detectable NMR signal from selected excited atomic particles (e.g., nuclei, electrons, etc.) of a specimen along a main intersection. The main intersection is the intersection of the first plane and the second plane of each pair. The excited nuclei radiate an RF signal which is processed to produce a one-dimensional image signal of the density of the selected atomic particles along the main intersection. Each of the plurality of main intersections is positioned to not take place either in the first or the second planes of all the pairs of planes projected prior thereto. Each of the second planes in each of the pairs of intersecting planes projected after the first pair of intersecting planes intersect prior projected first planes at minor intersections to cause generation of minor NMR echo signals of selected atomic particles of the specimen from each such minor intersection. Spoiler magnetic gradients are projected in said specimen to dephase all of the minor echo signals. Thereafter, the one-dimensional image signals are processed and displayed to form a composite two-dimensional image of the specimen.

In a preferred embodiment, the first plane is excited by a 90° RF pulse, and the second plane is excited by a 180° RF pulse. In addition, the first and second planes are essentially normal to each other and thereby intersect at approximately a 90° angle.

Preferably, the plane of each of the plurality of pairs of intersecting planes is substantially parallel to the first plane of the prior projected pair of plurality of pairs of intersecting planes. Similarly, the second plane of one of the plurality of pairs is substantially parallel to the second plane of a prior projected pair of intersecting planes. The gradient magnetic fields are desirably spatially varied in magnitude along the axis of an x, y and z cartesian coordinate system. The spoiler magnetic gradients are also projected along the x, y and z axes of the cartesian coordinate system. The first plane and the second plane are projected over a period of time from about 10 milliseconds to about 20 milliseconds. The plurality of pairs of planes are desirably about 24.

Apparatus for NMR imaging, in accordance with the method above described, includes a computer with a program for planar or non-planar line scan imaging. The apparatus is improved by modifying the program to project the plurality of pairs of planes in a sequence and also means to project spoiler magnetic gradients into the specimen to dephase all the minor echo signals.

BRIEF DESCRIPTION OF THE DRAWINGS

In the drawings which illustrate that which is presently regarded as the best mode for carrying out the invention.

DESCRIPTION OF THE ILLUSTRATED EMBODIMENT

Figure 1:
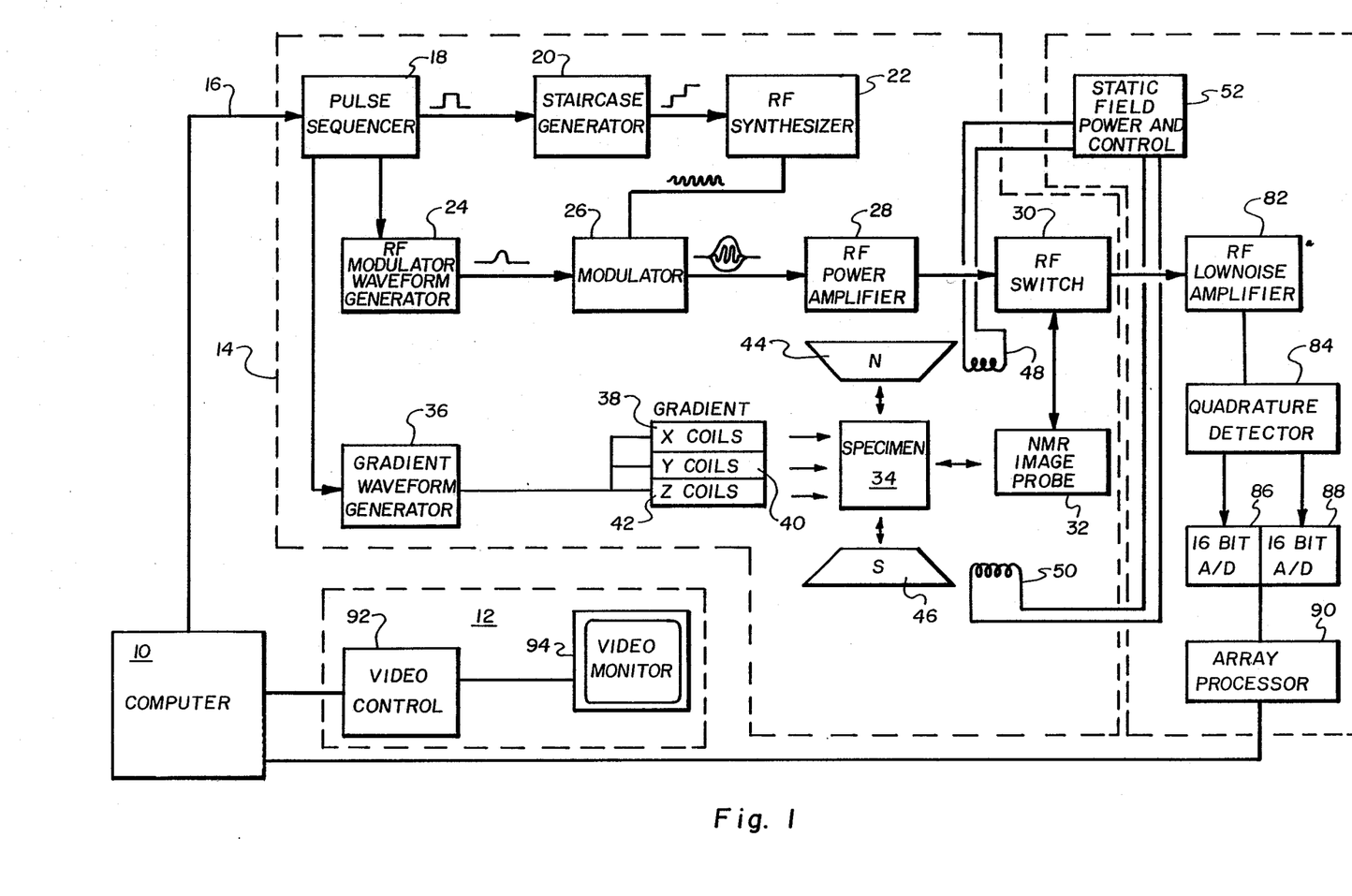
FIG. 1 is a schematic block diagram of an arrangement of components for NMR imaging.

Referring to FIG. 1, an NMR imaging apparatus is illustrated to be comprised basically of a computer system 10, a video system 12, and an NMR spectrometer comprising a transmitter 14 and signal processor 15.

The transmitter 14 generally receives an input via conductor means 16 from the computer 10 to cause a pulse sequencer circuit 18 to generate pulse signals at appropriate times and also in a predetermined sequence. The output of the pulse sequencer 18 is supplied to a staircase generator 20, which receives the input from the pulse sequencer 18 to generate a staircase signal. This staircase signal is supplied to a resonant radio frequency (RF) synthesizer 22 to generate an RF signal. The RF signal is a radio frequency signal which is selected to be the resonant frequency of particular target nuclei in a specimen or object to be examined by NMR imaging.

The output of the pulse sequencer 18 is also supplied through an RF modulator 24. The RF modulator 24 supplies a carrier or waveform which is combined with the output of the RF synthesizer 22 in a modulator 26. The output of the modulator 26 is amplified by power amplifier 28 and supplied via an RF switch 30 to an NMR image probe 32 positioned proximate or around the specimen 34. That is, in some applications, the probe may be positioned, for example, in a side-by-side manner with the specimen. However, it is preferred that the probe be formed and sized so that the specimen may be placed within it to in turn be around the specimen.

As seen in FIG. 1, the pulse sequencer 18 also supplies a signal to the gradient waveform generator 36, which generates magnetic field gradient pulse signals through x, y and z coils 38, 40 and 42 positioned proximate or around the specimen 34. The specimen 34, the gradient coils 38, 40 and 42 and the NMR image probe 32 are all positioned within a homogenous magnetic field (Ho) generated by an electromagnet here illustrated as electromagnets 44 and 46 which have coils 48 and 50 conductively connected to a static field power and control system 52. The static field power and control system 52 supplies electrical signals to the electromagnets 44 and 46, which may be very similar to the cylindrical magnet illustrated in U.S. Pat. No. 4,599,565. That is, the electromagnets 44, 46, 48 and 50 may be of any convenient or desired shape, but preferably are in the form of a donut or cylindrical and powered to produce a field of approximately one Tesla, which is a field of 10,000 gauss.

The gradient coils 38, 40 and 42 may be similar to the gradient coils illustrated in FIG. 1 of U.S. Pat. No. 4,599,565 and supply gradient signals along the axes of a three-dimensional cartesian system having an x axis, a y axis and a z axis all normal to each other, all in a manner well known in the art.

Figure 2:
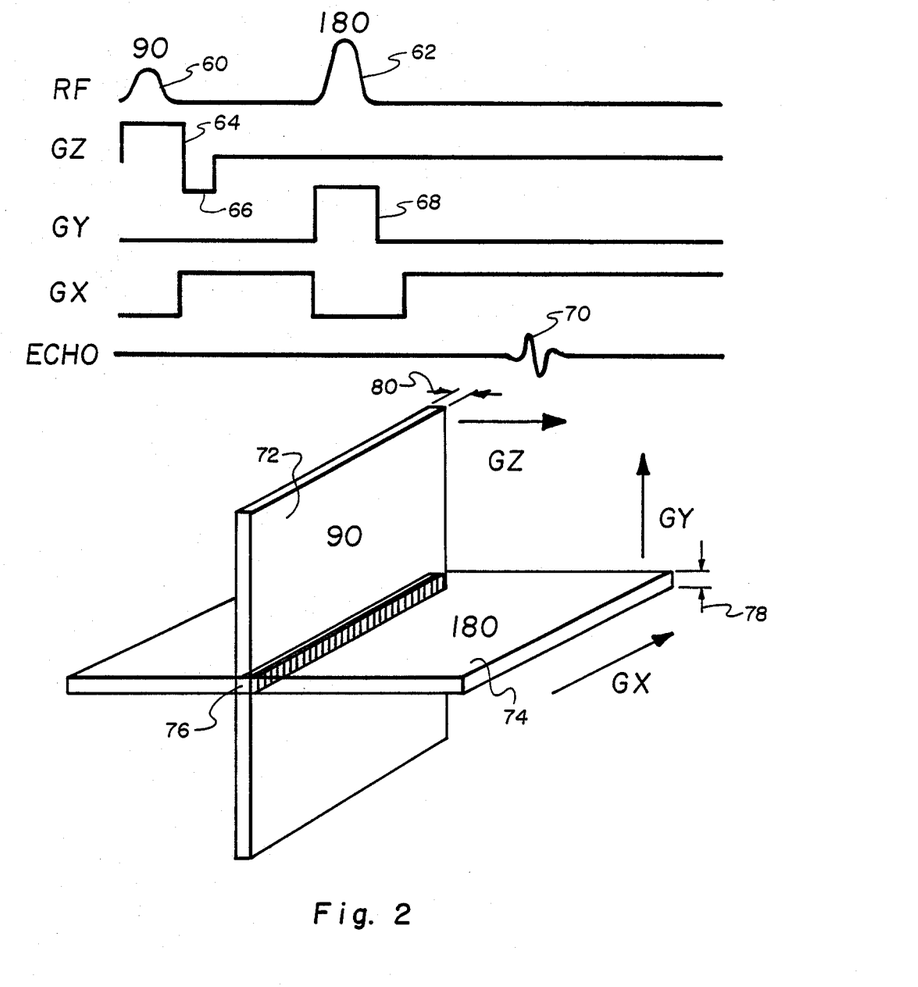
FIG. 2 is a simple line scan pulse sequence with a three-dimensional representation of planes of excited nuclei.

The pulse sequencer 18 causes the gradient coils 38, 40 and 42 to be periodically activated to cause a gradient magnetic field to be projected into the specimen. At the same time, the RF switch 30 is connected between the output from the RF power amplifier 28 and the NMR image probe 32 to optimize the NMR signal 34. The sequence effected by the pulse sequencer 18 results in the generation of a line scan pulse sequence, which is illustrated in FIG. 2. That is, a first resonant radio frequency (RF) signal or a 90° signal 60 is followed at a preselected appropriate time by a second RF signal or a 180° signal 62. A z axis positive gradient signal 64 is supplied substantially during the presence of the first 90° signal. Signal 60 is followed by a negative signal 66 for a period of approximately half the duration of the positive signal 64 but of substantially the same amplitude but in a negative direction.

The gradient y signal 68 is supplied through the y coil 40 (FIG. 1) to be present during the 180° signal 62. An x signal is supplied to be present during the time interval between the end of the first 90° RF signal 60 and the beginning of the 180° RF signal 62 and also following the 180° RF signal 62. A spin echo signal 70 follows the 180° pulse interval at a later time generally as shown. More particularly, a specimen, such as specimen 34 in FIG. 1, is positioned within a homogeneous static magnetic field as stated above after which z, x and y magnetic gradients are imposed thereon in sequence with the resonant radio frequency signals 60 and 62 to produce a first plane 72 of excited nuclei in the specimen and a second plane 74 of excited nuclei which may be substantially normal to the first plane 72 as shown. The spin echo 70 arises from only those nuclei on the line 76 of intersection of the two planes 72 and 74.

Although the planes 72 and 74 here shown are normal to each other, it should be recognized that other planar orientations can be used if desired for particular purposes. A normal orientation is preferred because the mathematics, and in turn the processing, are substantially simplified as known to those skilled in the art.

The intersection of the first plane 72 and the second plane 74 actually results in a linear volume 76. The planes 72 and 74 have some thickness 78 and 80 so that the intersection thereof is, in fact, a small elongated volume 76 which is nonetheless described as a line scan or a line volume. That is, the nuclei in the line or volume 76 are excited in both planes 72 and 74. After an appropriate free induction decay period, an appropriate pulse 70, which may also be described as an echo, is received from the nuclei in the line or volume 76, that echo or pulse 70 is detected by the probe 32 and processed.

Referring back to FIG. 1, a pulse such as echo 70 is received by the NMR image probe 32 and is supplied to the RF switch 30, which in turn supplies it to the RF low noise amplifier 82 which supplies an output to a quadrature detector 84 for demodulation. The detector 84 in turn supplies its output signals to a first 16 bit analog-to-digital (A-to-D) converter 86 and a second 16 bit analog-to-digital (A-to-D) converter 88. The array processor 90 receives the output of the A-to-D converters 86 and 88 and converts the information to a data stream acceptable as an input for the computer 10. Computer 10 in turn manipulates the output of the array processor 90 to generate signals reflective of a constructed video image which is supplied to a video controller 92 within the video system 12. The output of the video controller 92 is supplied to a video monitor 94 for appropriate visual display of an image.

Figure 3:
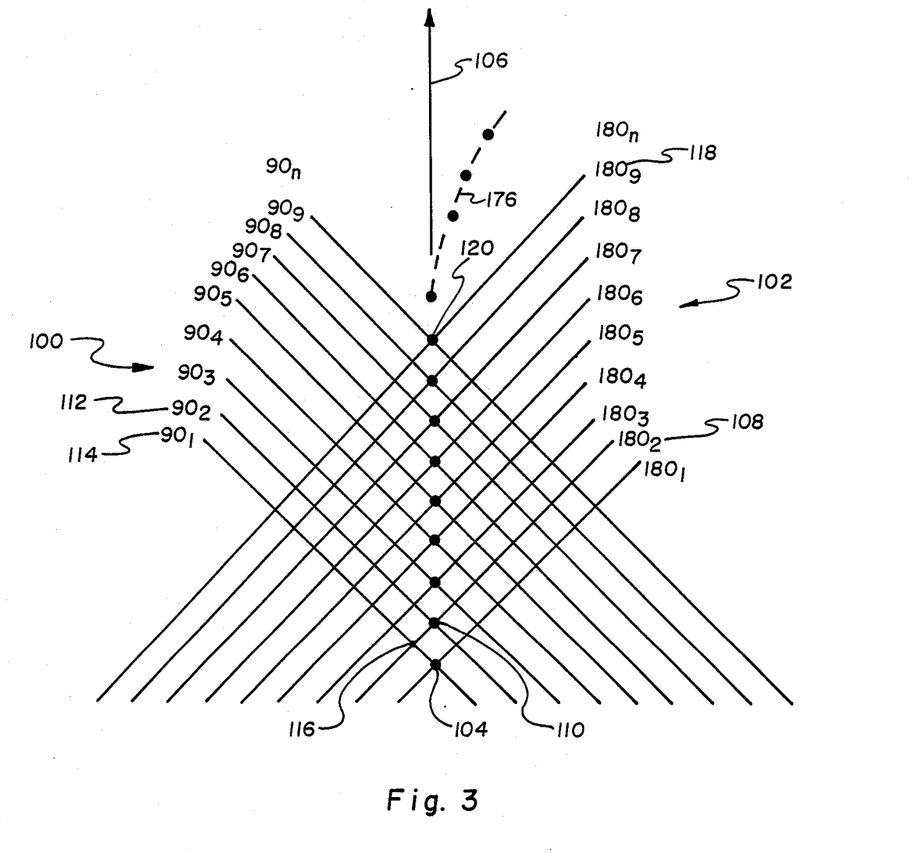
FIG. 3 is an illustration or depiction of multiple line scan sequences showing diagonal excitation.

Referring specifically to FIG. 3, a plurality of 90° planes is generally depicted by the number 100. Each 90° plane is shown with subscripts 1 through n. Similarly, intersecting 180° planes are shown by the number 102 with subscripts 1 through n. The 90° - planes 100 and 180° planes 102 are each developed in sequential pairs by projecting the gradient magnetic fields. Of course, each of the pairs, such as $90_1$ and $180_1$, result in a main intersection 104. Since each of the pairs of planes (1 through n) is developed sequentially, it can be seen that a sequential plurality of line volumes, such as line volume 76, is generated along a locus 106 to create what may be regarded as a slice or two-dimensional image on the video monitor 94. This type of excitation may be referred to as diagonal excitation.

However, in the process of projecting gradient magnetic fields to generate the plurality of planes as illustrated in FIG. 3, it can be seen that the second 180° plane 108 generates or intersects a second 90° plane 112 at a major intersection 110 but also intersects the first 90° plane 114 at a minor intersection 116. Similarly, it can be seen that other 180° planes that following the second 180° plane 108 will similarly have a major intersection but also one or more minor intersections. For example, the ninth plane 118 will have a major intersection 120 and eight minor intersections intersecting the 90° planes of $90_1$ through $90_8$. Even though intersections by the subsequent 90° planes with earlier 180° planes occur, the echoes therefrom are not likely to be of practical concern.

Each of the minor intersections (e.g., 116) produces what may be regarded as an unwanted secondary echo at the same time as another primary echo is produced at a major intersection. However, it would be very difficult to determine from the echo which intersections (i.e., major or minor) are contributing and to what extent to the NMR signal being detected by the probe 32. Indeed, in some circumstances, the major line intersection or main intersection such as intersections 104, 110 and 120 may be adversely affected by subtraction or addition in magnitude by minor intersection signals stemming from minor intersections. Substantial artifacts or ambiguities will thereby be introduced which heretofore can be avoided in the conventional slow line scan technique by delaying the transmission of the second 90° plane 112 and the second 180° plane 108 until an appropriate decay period has occurred after termination of the magnetic field causing the creation of the first 90° plane 114. In short, in the known conventional slow line scan techniques, a substantial delay is needed between the transmission of successive pairs of 90° and 180° planes 100 and 102, respectively.

Figure 4:
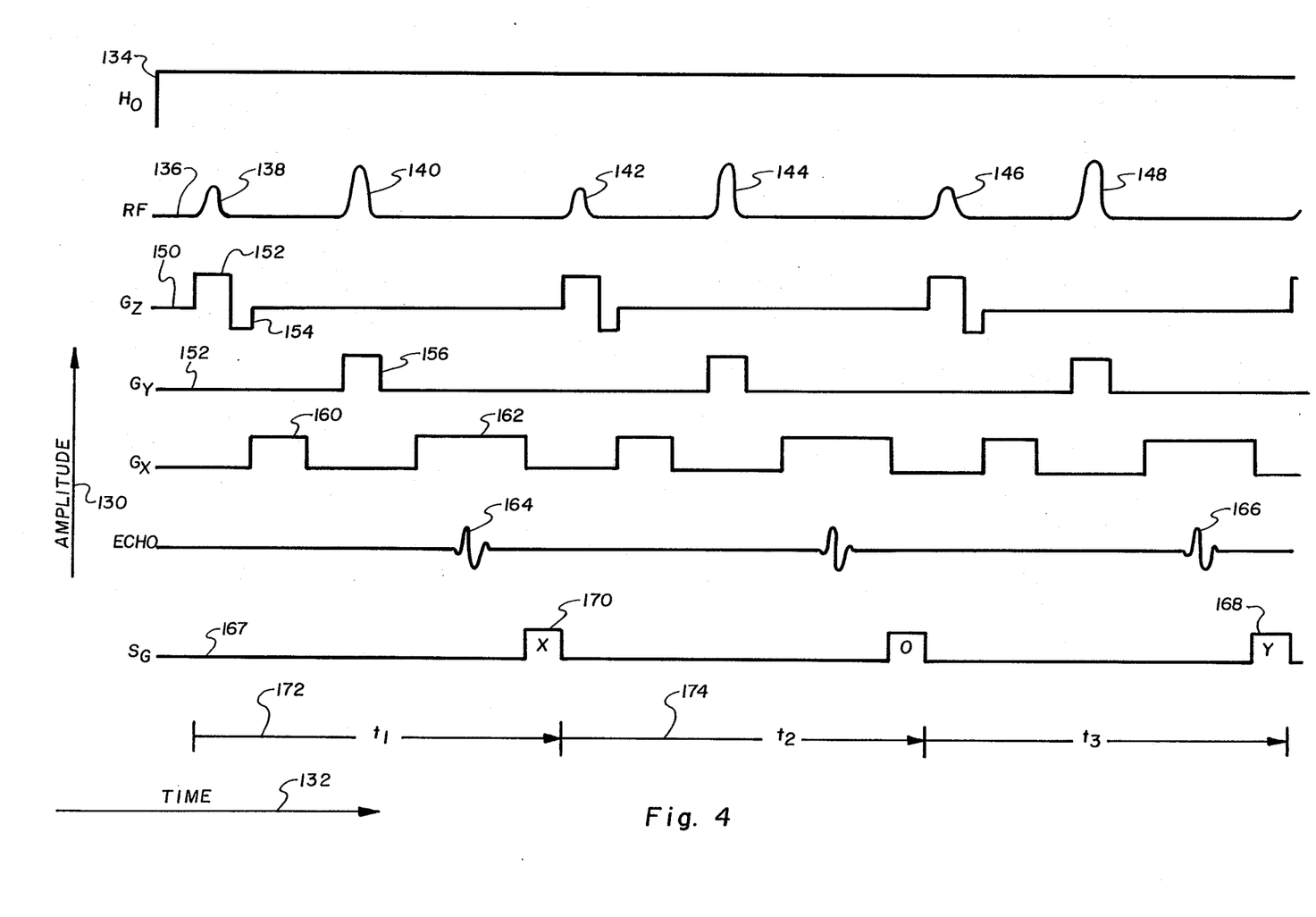
FIG. 4 is a pulse chart illustrating a sequence of significant pulses, magnetic fields and signals in accordance with the invention.
Figure 5:
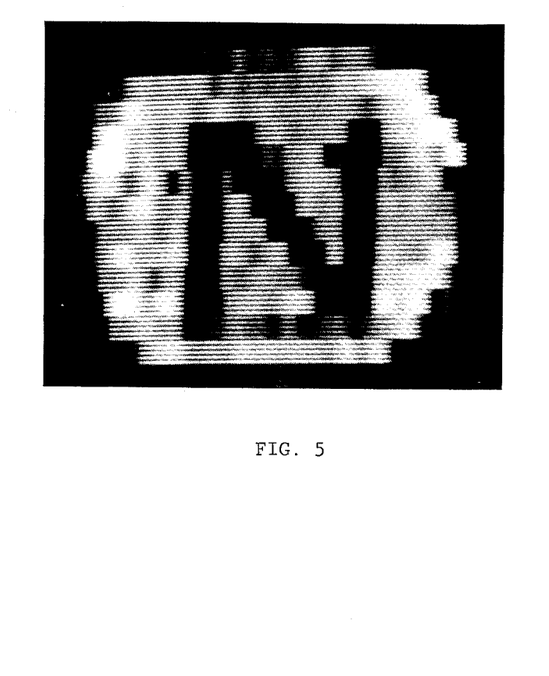
FIGS. 5–8 show images of an object obtained by NMR apparatus and techniques of the instant invention.

This delay can be avoided so that rapid sampling can be effected, as illustrated in FIG. 4, by use of an additional magnetic field which is the spoiler magnetic field 167 and which is generated using selectively the x 38, y 40, and z 42 coils to dephase the signals or minor echoes being generated at the minor intersections so that a clear and unambiguous main intersection signal, such as the signals received from such main intersections as 104, 110 or 120, can be received and appropriately processed to create the desired image on the monitor 94.

Referring specifically to FIG. 4, signals are graphically presented in a generally x-y coordinate system having a vertical axis 130 reflective of amplitude of the various signals and a horizontal axis 132 reflecting time. The upper graph 134 simply illustrates the fact that the homogeneous magnetic field signal Ho is continuously applied to specimens such as specimen 34 in FIG. 1. An RF graph 136 shows the periodic generation of a resonant radio frequency (RF) signal, the first of which is a 90° signal 138 and the second of which is a 180° signal 140. The 90° signal is denominated because the RF pulse is supplied long enough to cause the target nuclei to precess through an angle of 90° (e.g., 1.6 milliseconds for a proton nucleus at a selected amplitude of about 0.04 gauss). Similarly, the 180° signal is so denominated because the RF pulse is supplied long enough to cause the target nuclei to precess through an angle of 180°.

FIG. 4 shows the RF signal being periodically repeated 142, 144, 146 and 148. The z gradient signal 150 is shown being generated to be coincident with the generation of the 90° RF signal 138. That is, a positive z gradient signal 152 is generated during the presence of the 90° RF signal 138. The positive z signal is immediately followed by a negative z signal of approximately the same negative amplitude as the positive amplitude of the signal 152 but of approximately one-half the duration 154. This signal sequence is repeated as can be seen in FIG. 4 each time a 90° signal, such as signals 142 and 146, is present.

The y gradient signal 152 is generated to be present during the generation of each 180° signal as can be seen in FIG. 4. An x gradient signal is shown here to be generated during the time interval from the end of the 90° RF pulse signal 138 to the beginning of the 180° RF pulse signal 140 and also again for a period of time 162 during the time interval between the end of the 180° signal, such as signal 140, and the beginning of the next 90° signal, such as signal 142. An echo, such as echo 164, is generated at and received from the main intersection, such as intersection 76 (FIG. 2), from each of the pairs of intersecting planes, as seen in FIG. 3, after the 180° signal and during the positive gradient 162. To dephase the subsequent unwanted echo signals that are to be received from minor intersections, such as intersection 116 (FIG. 3), a spoiler gradient is supplied on the various coils 38, 40 and 42. That is, a spoiler gradient 170 is applied to the x coil 38 shortly after receiving the first main echo 164 to dephase all of the minor echoes which may follow thereafter. A y coil spoiler gradient is supplied after the third echo 166. As can be seen in Table 1 following, positive spoiler gradients are generated in the x, y and z coils 38, 40 and 42 followed by zero spoiler gradients and then by negative spoiler gradients in the same coils 38, 40 and 42 respectively, followed again by zero spoiler gradients. That is, a reverse current is passed through the coils to generate a negative or reverse gradient magnetic field in relation to the positive gradient magnetic field generated by supplying electrical current through the x, y and z coils 38, 40 and 42 in the normal direction.

TABLE 1

| Echo Number | Spoiler Gradient |
| --- | --- |
| 1 | x |
| 2 | 0 |
| 3 | y |
| 4 | 0 |
| 5 | z |
| 6 | 0 |
| 7 | −x |
| 8 | 0 |
| 9 | −y |
| 10 | 0 |
| 11 | −z |
| 12 | 0 |
| 13 | x |
| 14 | 0 |
| 15 | y |
| 16 | 0 |
| 17 | z |
| 18 | 0 |
| 19 | −x |
| 20 | 0 |
| 21 | −y |
| 22 | 0 |
| 23 | −z |
| 24 | 0 |
| 25 | x |
| 26 | 0 |

From FIG. 4 it can be seen that a pair of planes can be excited by appropriate application of magnetic fields in sequential periods such as periods $t_1$ 172 and $t_2$ 174. Each of the periods $t_1$ and $t_2$ 174. Each of the periods $t_1$ and $t_2$ are selected to be approximately from about 10 to about 20 milliseconds in length and typically about 15 milliseconds in length. Thus, the nuclei in a 24 line volume can be excited in approximately 360 milliseconds, which, of course, is approximately one-third of a second. In other embodiments, shorter times 172 and 174 may be used and in addition, more planes may be projected as desired. In the illustrations of FIG. 4, including the spoiler gradients identified in Table 1, a 24 line scan procedure is contemplate with each line volume being taken using a 15-millisecond period of excitation.

Referring back to FIG. 3, it can be seen that the main intersections, such as intersections 104, 110 and 120, appear to be in a straight line and spatially aligned on their ends as a locus of points 106 resulting in a two-dimensional planar image on the face of the video monitor 94. It should also be appreciated that the planes, such as planes 100 and 102, can be projected so that the locus 106 appears as shown in dotted line 176 corresponding to an image of a non-planar surface. That is, the main intersection point, such as intersection 120, for subsequent planes through planes $90_n$ and $180_n$ does not necessarily need to fall along a straight line, such as the straight line locus 106. Rather subsequent intersection may follow a curve or locus 176 to conform, for example, to the exterior surface of a particular object or specimen.

EXAMPLE ONE

Figure 6:
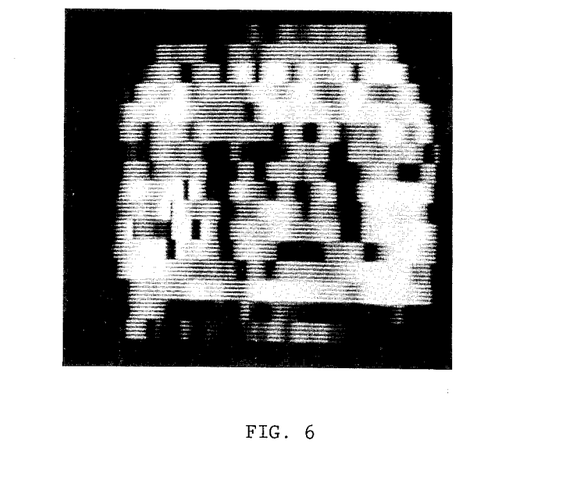
Figure 7:
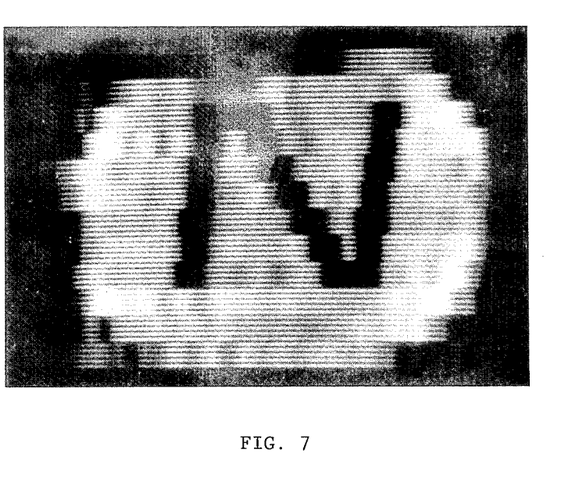
Figure 8:
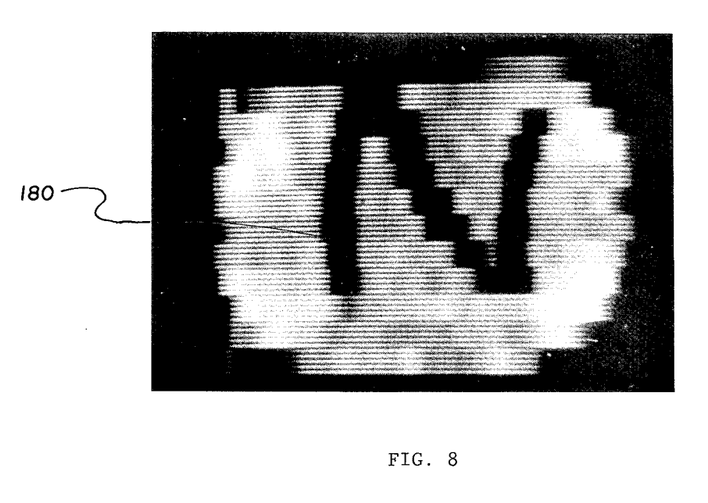

Referring now to FIGS. 5–8, a plastic specimen in the shape of the letter "N" was positioned in a water medium in an NMR apparatus similar to that of specimen 34 (FIG. 1). The NMR system such as that of FIG. 1 was operated as described with respect to FIGS. 3 and 4 to produce the image seen in FIG. 5 within 250 milliseconds. Without spoiler gradients, such as the spoiler gradient signals 170 and 168 occurring on graph 167 (FIG. 4), the image as seen in FIG. 6 was obtained. In FIG. 7, the "N" was rotated in the presence of spoiler gradients at the rate of one-eighth of a revolution every second. FIG. 8 shows the "N" being rotated at the rate of one-third of a revolution per second. As seen in FIG. 8, some amount of bending of the legs, such as leg 180, can be seen stemming from the higher rate of rotation. Some amount of bending is also noted in FIG. 7, but not to the same degree. However, there are no artifacts from the motion which would be apparent due to blurring or whiteness from spurious or apparent NMR signal within the interior of the "N."

EXAMPLE TWO

Figure 9:
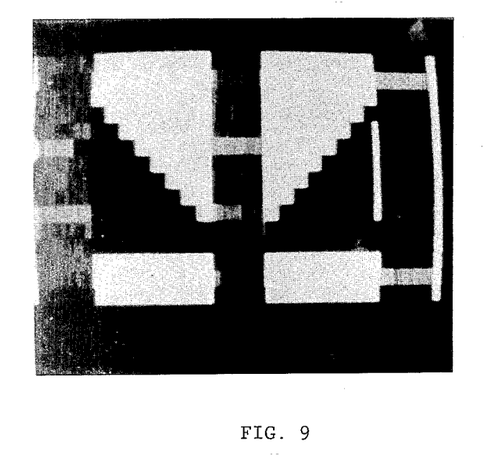
FIGS. 9–11 show images of objects obtained by NMR apparatus and techniques of the instant invention.
Figure 10:
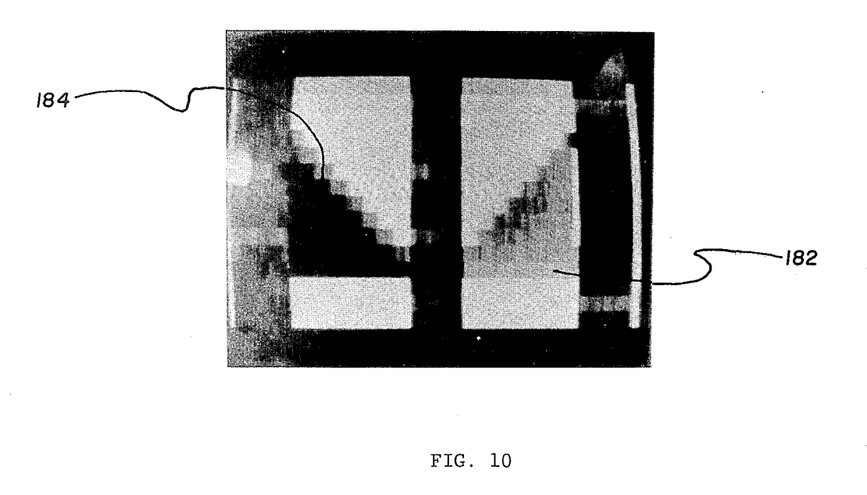
Figure 11:
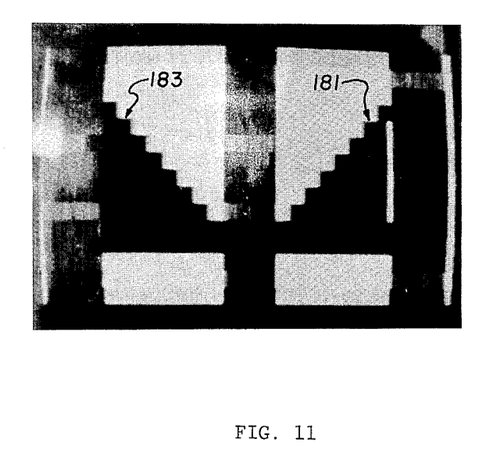

An image of a stationary plastic phantom was irradiated by NMR imaging techniques using the system of FIG. 1 in accordance with the procedures illustrated in FIGS. 3 and 4. The phantom consists of two plastic staircases submerged in water. The staircase on the right 181 is thinner and thus more susceptible in the center to artifacts from spurious echoes arising from water at the edges. The staircase on the left 183 is thicker and thus less susceptible to spurious echoes. FIG. 9 shows a planar image through the center obtained using the slow or conventional line scan technique. FIG. 10 shows the same object using the rapid line scan technique of the instant invention but without application of the spoiler gradient, such as the spoiler gradient of line 167, and in particular gradients such as 170 and 168 (FIG. 4 and Table 1). The lighter region in 182 in the lower right side of FIG. 10 is illustrative of the spurious echoes and the presence of corresponding artifacts than in the darker image 184 of the thicker staircase on the left side of FIG. 10. FIG. 11 shows an image of the same plane obtained using the rapid line scan methodology and apparatus, including particularly the use of the spoiler gradient curve SG (FIG. 4). The absence of ambiguities and artifacts can be seen with a quality of presentation at least equal to that of FIG. 9. However, the image of FIG. 11 was taken in approximately 360 milliseconds in comparison to the several minutes needed to create the image of FIG. 9.

EXAMPLE THREE

Figure 12:
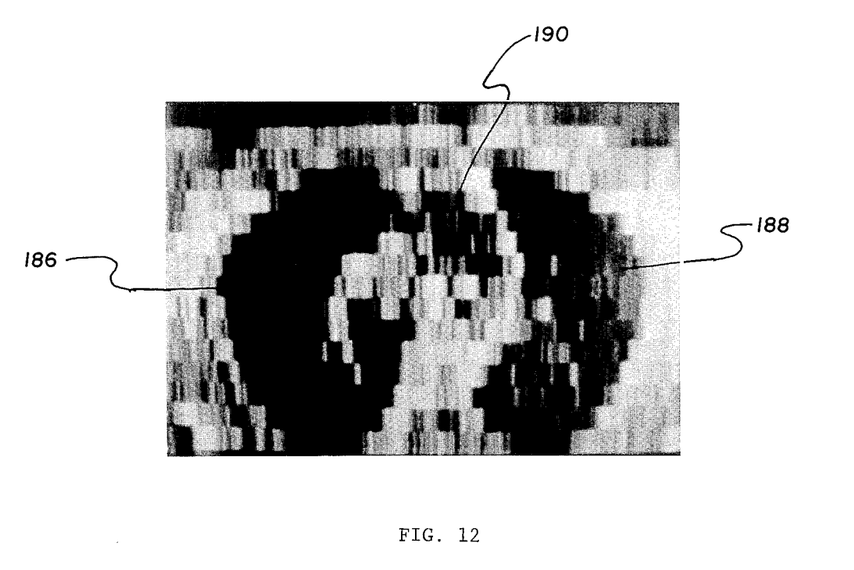
FIGS. 12 and 13 show the image of a heart and lung of a human created by NMR apparatus and techniques of the instant invention.
Figure 13:
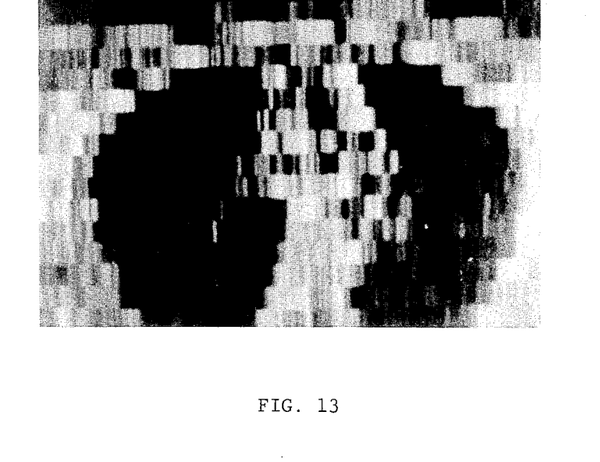
Figure 14:
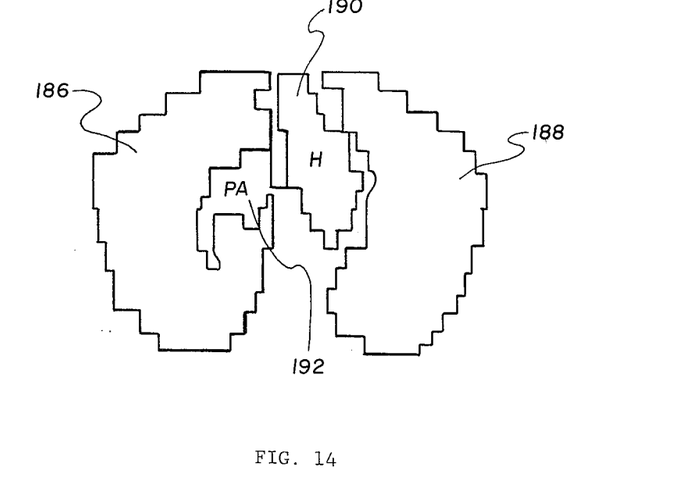
FIG. 14 is a simplified graphic illustration of that which can be seen in FIG. 12.

The thorax of a living non-sedated spontaneously breathing human was subjected to NMR techniques of the instant invention. FIG. 12 shows the left 186 and right 188 lungs together with the heart 190. FIG. 13 is taken in substantially the same location but somewhat later in time. It should be noted that the heart area has contracted, and blood has flown through what is believed to be the pulmonary artery so that it is no longer apparent in FIG. 13. FIGS. 12 and 13 were obtained from only one excitation of each region without signal averaging. FIG. 14 is a graphical illustration of what is best seen in FIG. 2. More particularly, the lungs 186 and 188, heart 190 and what is believed to be the pulmonary artery 192 are illustrated.

In all the examples, the substantial dimensions of the pixels suggest a low-quality image. However, it should be appreciated that a rather high-quality image is here present and can be improved substantially be going to the use of more planes and smaller volumes and by using signal averaging techniques.

OPERATION AND EMBODIMENT

It should be understood that in the conventional slow technique the spin lattice relaxation time ($T_1$) is generally substantially longer than $t_1$ 172 and $t_2$ 174 (FIG. 4). That is, if the times $t_1$ and $t_2$ are equal or longer than the relaxation time $T_1$, then no unwanted NMR echo signals will occur. However, if the times $t_1$ and $t_2$ are short enough to cause unwanted echoes, then spoiler gradients such as those appearing on line 167 of FIG. 4 should be used to prevent occurrence of the unwanted or spurious echoes.

It should also be understood that the use of the same (i.e., having the same magnitude, direction and sign) spoiler gradient in each time interval (e.g., $t_1$, $t_2$ . . . ) would not be effective. The same gradient would be present on both sides of each 180° signal. Hence, dephasing due to the first spoiler gradient would be reversed by dephasing during the second spoiler gradient.

A very efficient sequence of spoiler gradients that suppresses the 138 extra unwanted echoes for a 24-line image arising from nuclei in intersections of previously excited 90° planes is depicted in FIGS. 3 and 4. For example, when the ninth 180° plane crosses the first 90° plane, the result in spoiling is equivalent to a $Y+2Z-X$ gradient having been turned on before the spurious echo would have occurred at the position of the seventeenth line scan. Longer sequences could be made by doubling the gradients, but the sequence as shown in FIG. 4 will suppress all echoes out to 360 milliseconds. After 360 milliseconds, the effects of the dephasing due to the spin-spin relaxation ($T_2$) should cancel out most echoes, allowing for continuous scanning.

It should be appreciated that the object or specimen 34 (FIG. 1) may be a living person or patient. However, in such circumstances, motion induced by blood flow or breathing and heart pumping will not be disruptive and produce artifacts by use of the apparatus and method of the instant invention because (1) the speed of the image-taking process is so fast as to render inconsequential any artifacts thereby created and (2) information from spatially separate regions is obtained sequentially in time.

In effect, a single line scan is repeated in order to generate an image which may be planar but also non-planar if desired. The line may be regarded as rapid while it roves (under guidance by the operator of the NMR apparatus) through the subject or specimen to be examined in a time comparable to that of current two-dimensional Fourier transform (2DFT) techniques without suffering the disadvantages of the 2DFT techniques. That is, the advantage of line scan techniques (i.e., free of motional artifacts, etc.) can be obtained without the principal disadvantage of extended or excessive time to scan.

It may also be noted that the specimen or the object need not be a human object but may be any physical object in which an NMR image is desired. Furthermore, motional periodicity is not required as in other imaging techniques of moving objects; rather, an image or "snap-shot" can be obtained of an isolated movement or other non-periodic motion. It is particularly noted that imaging of this nature could be used to ascertain the nature of turbulence over a wing by flowing a liquid over the wing in the presence of appropriate magnets placed in a controlled environment to effect NMR imaging.

It may be appreciated that the NMR imaging system as here illustrated is assembled of generally available components. For example, any appropriate general purpose computer may be used as the computer 10 (FIG. 1), including a Digital Equipment VAX 11/730 or Microvax II computer. The RF synthesizer 22 may be an A.C. ADRET Synthesizer Model No. 3300A. The radio frequency modulator 24 may be an EXACT 7060 generator connected to the modulator 26, which is a Mini-Circuit Lab Modulator PA5-3. The amplifier 28 is an MHW192 which is a one watt radio frequency amplifier. The RF switch 30 is a cross-diode circuit with the RF low noise amplifier 82 being an ANZAC AM-107 with a gain of 30 db. The gradient waveform generator 36 is an Analogic D/A.

The quadrature detector 84 is constructed by using a double-balanced ANZAC AD-209 with differential outputs that are amplified by two independent Tektronics audio amplifiers AM-502. The A-to-D converters 86 and 88 are Analogic ADC-410 systems. The array processor is an Analogic AP-400.

Alternately, an Analogic AM-9100 system may be used in lieu of the pulse sequencer 18, RF modulator 24, and modulator 26, as well as the gradient waveform generator 36 and quadrature detector 84. The Analogic AM-9100 may also include circuitry to include the A-to-D converters 86 and 88.

Those skilled in the art will recognize that the equipment above described would be connected in a conventional fashion to produce NMR imaging, particularly with a program in the computer selected for that purpose.

Those skilled in the art will recognize that the above-described embodiments are merely illustrative of the principles of the invention and are intended to limit the scope of the claims, which themselves recite the limitations regarded as essential to the invention.

What is claimed is:

1. A method of NMR line scan imaging, said method comprising:

positioning a specimen within a main magnetic field;
sequentially applying gradient magnetic fields to generate a plurality of pairs of intersecting planes to sequentially produce a plurality of main intersections, each of said pairs of planes being comprised of a first plane and a second plane intersecting the first plane, each of said first and second planes being a plane containing atomic particles of a specimen excited by magnetic fields varied at a selected resonant frequency to cause generation of detectable NMR signals of selected atomic particles of said specimen along said main intersection which is the intersection of the said first plane and the said second plane to produce a one-dimensional image signal of the population of said selected atomic particles at said main intersection, said plurality of main intersections occurring not in the first and second planes of each pair of planes projected prior thereto;

applying spoiler magnetic gradients in said specimen to dephase and in turn prevent the occurrence of minor NMR echo signals wherein each of said second planes in each of the said pairs of intersecting planes projected after the first pair of intersecting planes intersecting prior projected first planes at minor intersections would otherwise cause generation of minor NMR echo signals of selected atomic particles of the specimen; and processing and displaying the one-dimensional image signals of each main intersection to form a composite two-dimensional image of the said specimen.

2. The method of claim 1 wherein said first plane is a 90° plane and said second plane is a 180° plane which normally intersects said first plane.

3. The method of claim 2 wherein the first plane of one of said plurality of pairs of intersecting planes is substantially parallel to the first plane of the prior projected pair of said plurality of pairs of intersecting planes, and wherein the second plane of one said plurality of pairs of intersecting planes is substantially parallel to the second plane of the prior projected pair of said pairs of intersecting planes.

4. The method of claim 3 wherein the gradient magnetic fields vary spatially in magnitude along the axis of an x, y and z cartesian coordinate system.

5. The method of claim 3 wherein said spoiler magnetic gradients are projected along the said x, y and z axes.

6. The method of claim 4 or 5 wherein each first plane and second plane extends over a period of time from about 10 milliseconds to about 20 milliseconds.

7. The method of claim 6 wherein said two-dimensional image is a planar image.

8. An apparatus for NMR imaging which includes a computer with a program for line scan imaging or planar imaging, the improvement comprising: modifying the program of the computer to cause the NMR imaging apparatus to sequentially apply gradient magnetic fields to generate a plurality of pairs of intersecting planes to sequentially produce a plurality of main intersections, each of said pairs of planes being comprised of a first plane and a second plane intersecting the first plane, each of said first and second planes being a plane containing atomic particles of a specimen excited by magnetic fields varied at a selected resonant frequency to cause generation of detectable NMR signals of selected atomic particles of said specimen along said main intersection which is the intersection of the said first plane and the said second plane to produce a one-dimensional image signal of the population of said selected atomic particles at said main intersection, said plurality of main intersections occurring not in the first and second planes of each pair of planes projected prior thereto; and means to apply spoiler magnetic gradients in said specimen to dephase and in turn prevent the occurence of minor NMR echo signals wherein each of said second planes in each of the said pairs of intersecting planes projected after the first pair of intersecting planes intersecting prior projected first planes at minor intersections would otherwise cause generation of minor NMR echo signals of selected atomic particles of the specimen.

9. The apparatus of claim 8 further including means to cause said main intersections to follow a non-planar locus.

* * * * *

UNITED STATES PATENT AND TRADEMARK OFFICE
CERTIFICATE OF CORRECTION

PATENT NO.  : 4,818,937

DATED       : APRIL 4, 1989

INVENTOR(S) : DAVID C. AILION ET AL.

It is certified that error appears in the above-identified patent and that said Letters Patent is hereby corrected as shown below:

After the title at column 1 and before the "Background of the Invention", please insert:

---This invention was made with government support under Grant numbers NIH R01-CA 44972-01 and R01-HL 31216-03 awarded by the Department of National Institute of Health. The government has certain rights in the invention.---

Signed and Sealed this

Thirtieth Day of March, 1993

Attest:

STEPHEN G. KUNIN

Attesting Officer

Acting Commissioner of Patents and Trademarks